United States Patent
Ikeda et al.

(10) Patent No.: US 11,953,461 B2
(45) Date of Patent: Apr. 9, 2024

(54) ELECTRODE STRUCTURE

(71) Applicant: Hitachi High-Tech Corporation, Tokyo (JP)

(72) Inventors: Ukyo Ikeda, Tokyo (JP); Tetsuyoshi Ono, Tokyo (JP); Hiroki Nakatsuchi, Tokyo (JP); Masafumi Miyake, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 763 days.

(21) Appl. No.: 17/045,826

(22) PCT Filed: Apr. 8, 2019

(86) PCT No.: PCT/JP2019/015335
§ 371 (c)(1),
(2) Date: Oct. 7, 2020

(87) PCT Pub. No.: WO2019/198670
PCT Pub. Date: Oct. 17, 2019

(65) Prior Publication Data
US 2021/0140913 A1    May 13, 2021

(30) Foreign Application Priority Data
Apr. 10, 2018    (JP) .............. JP2018-075095

(51) Int. Cl.
*G01N 27/333*    (2006.01)
*G01N 27/28*    (2006.01)
(Continued)

(52) U.S. Cl.
CPC ......... *G01N 27/333* (2013.01); *G01N 27/283* (2013.01); *G01N 27/416* (2013.01); *G06K 19/00* (2013.01); *H01L 23/28* (2013.01)

(58) Field of Classification Search
None
See application file for complete search history.

(56) References Cited

U.S. PATENT DOCUMENTS

| 5,427,938 A | 6/1995 | Matsumura et al. |
| 5,665,653 A | 9/1997 | Bare et al. |
(Continued)

FOREIGN PATENT DOCUMENTS

| JP | H042152 A | 1/1992 |
| JP | H04196141 A | 7/1992 |
(Continued)

OTHER PUBLICATIONS

Search Report dated Nov. 29, 2021 in European Application No. 19785253.6.
(Continued)

*Primary Examiner* — J. Christopher Ball
(74) *Attorney, Agent, or Firm* — Miles & Stockbridge, P.C.

(57) ABSTRACT

An electrode formed by molding a semiconductor device with resin. The electrode comprises: a first resin mold portion formed on a front surface of the semiconductor device and having a first thickness (t1); a second resin mold portion formed on a back surface of the semiconductor device and having a second thickness (t2) greater than the first thickness; and an exposed portion formed in a part of the first resin mold portion corresponding to an end of the semiconductor device.

12 Claims, 8 Drawing Sheets

(51) Int. Cl.
*G01N 27/416* (2006.01)
*G06K 19/00* (2006.01)
*H01L 23/28* (2006.01)

(56) References Cited

U.S. PATENT DOCUMENTS

| | | |
|---|---|---|
| 5,690,893 A | 11/1997 | Ozawa et al. |
| 2012/0175254 A1 | 7/2012 | Kobayashi et al. |
| 2014/0132274 A1 | 5/2014 | Freeman et al. |
| 2015/0076567 A1* | 3/2015 | Stimpson .............. H01L 23/293 |
| | | 257/253 |

FOREIGN PATENT DOCUMENTS

| | | |
|---|---|---|
| JP | H0774195 A | 3/1995 |
| JP | H1187385 A | 3/1999 |
| NO | 2011034170 A1 | 3/2011 |

OTHER PUBLICATIONS

Search Report dated Jul. 2, 2019 in corresponding International Application No. PCT/JP2019/015335.
Written Opinion dated Jul. 2, 2019 in corresponding International Application No. PCT/JP2019/015335.

* cited by examiner

BB' CROSS SECTION

ELECTRODE STRUCTURE

TECHNICAL FIELD

The present invention relates to an electrode structure.

BACKGROUND ART

For example, in an analyzer for clinical examination, it is required to record information such as an individual identification code, a period of use, a state of use, and the like for a purpose of reducing medical mistakes and quickly responding to occurrence of mistakes. Then, an electrode, on which a semiconductor device such as a memory card for recording this information is mounted, has been proposed (see PTL 1).

On the other hand, there is a demand for miniaturizing the analyzer, and accordingly, a small electrode on which a semiconductor device is mounted is also required.

As a technique for miniaturizing the electrode on which the semiconductor device is mounted, a method of insert-molding the semiconductor device during injection-molding has been proposed. In the insert-molding method, the semiconductor device and an electrode housing are integrated without any gap, and the electrode is miniaturized while maintaining characteristics of the semiconductor device. However, in the insert-molding method, the semiconductor device such as a memory card may be bent and destructed by a pressure of a molten resin. As a measure against this, a method of preventing deformation by supporting a bending side with a jig or the like has been proposed (see PTL 2).

CITATION LIST

Patent Literature

PTL 1: WO 2011/034170
PTL 2: JP-A-11-87385

SUMMARY OF INVENTION

Technical Problem

However, in PTL 2, a bending direction of the memory card cannot be known until the molding is actually performed once. Further, a mold must be modified after the bending direction of the memory card is confirmed. Therefore, in PTL 2, a development period and a development cost are increased.

An object of the invention is to provide an electrode structure capable of preventing destruction of a semiconductor device without increasing a development period and a development cost.

Solution to Problem

An electrode structure according to one aspect of the invention is an electrode formed by resin molding a semiconductor device, and includes a first resin mold portion formed on a front surface of the semiconductor device and having a first thickness, a second resin mold portion formed on a back surface of the semiconductor device and having a second thickness greater than the first thickness, and an exposed portion formed in a part of the first resin mold portion corresponding to an end of the semiconductor device.

An electrode structure according to one aspect of the invention is an electrode formed by resin molding a semiconductor device, and includes a first resin mold portion formed on a front surface of the semiconductor device and having a first thickness, a second resin mold portion formed on a back surface of the semiconductor device and having a second thickness greater than the first thickness, and an exposed portion formed in a part of the first resin mold portion corresponding to an end of the semiconductor device. The exposed portion is formed by bringing the end of the semiconductor device into contact with a part of a mold used when the electrode is formed by resin molding the semiconductor device.

Advantageous Effect

According to one aspect of the invention, it is possible to provide the electrode structure capable of preventing destruction of the semiconductor device without increasing the development period and the development cost.

DESCRIPTION OF EMBODIMENTS

An electrolyte analyzer is a device for measuring concentrations of various ions contained in a specimen separated from blood or urine for analysis of human health. There are various types of electrolyte analyzers, one of which is a method of indirectly measuring an ion concentration by using an ion-selective electrode. The ion-selective electrode structurally has a flow path through which the specimen flows, and a part of the flow path is formed of an ion-selective membrane that captures only specific ions.

In addition, the ion-selective electrode has an external terminal and the ion-selective membrane is electrically connected to the external terminal, so that an electromotive force corresponding to an amount of ions captured by the ion-selective membrane is transmitted to the external terminal. The specimen flows through the flow path of the electrode, and the ion concentration is estimated by measuring a potential change of the external terminal according to the ion concentration of potassium or sodium in the specimen.

The ion selective electrode is manufactured by the following method.

An electrode housing including a specimen flow path is injection-molded with thermoplastic resin. At this time, a flow path is formed in which a part thereof is opened, or the opening is performed by cutting or the like afterward, and then an ion-selective membrane is adhered to the opening portion, such that the part of the flow path serves as the ion-selective membrane. An analog terminal is inserted into the electrode housing at a predetermined position and electrically connected to the ion selective membrane.

Ion concentration measurement using the ion-selective electrode is highly accurate, but when the electrode vibrates, the electromotive force changes, albeit slightly. This can be interpreted as influence of a change in specimen ion concentration distribution near the ion-selective membrane due to the vibration. When the vibration is significant, the vibration becomes noise and hinders stability of the measurement. However, when the vibration is below a certain level, the change in the electromotive force is so small that the change can be ignored. There is a method of mounting an acceleration sensor on the electrode and measuring and analyzing the vibration of the electrode, in order to investigate magnitude of the vibration.

Examples of a method of mounting a sensor or a memory on the ion-selective electrode include adhesion using an adhesive agent or screwing. For the adhesion, the electrode housing provided with a space for storing the sensor and the memory is injection-molded, the adhesive agent is applied to the space, the sensor or the memory, and then the sensor or the memory is inserted and fixed in the space.

Here, it is premised that the acceleration sensor moves (vibrates) integrally with the electrode to be sensed. Due to the adhesive agent, the vibration is absorbed and correct acceleration cannot be obtained. In addition, even when an adhesive force is reduced due to the vibration or deterioration over time and peeling off thereof occurs, the correct acceleration cannot be obtained.

On the other hand, the screwing is performed by the following procedure. The electrode housing provided with a space for storing a sensor and a through hole or notch connected to the space is injection-molded. A pressing plate that has the same through hole (notch) is prepared. The sensor is provided in the space inside the electrode housing, the sensor is sandwiched between the pressing plate and the housing, and tightened with a bolt having a head larger than the through hole and a nut. Here, due to rigidity of the pressing plate, the sensor does not vibrate integrally with the electrode, and the correct acceleration cannot be obtained. In addition, it is necessary to make the space inside the electrode housing and the pressing plate larger than the sensor by amounts of the bolt and nut, which is an obstacle to miniaturization.

Here, by insert-molding the sensor and the memory during the injection-molding, the sensor, the memory, and the electrode housing can be integrated without a gap, and the electrode can be miniaturized while maintaining characteristics of the sensor and the memory.

The procedure of insert-molding the sensor will be described below. The sensor is provided in a mold having a space (cavity) in a form of the electrode housing. At this time, a portion of the sensor such as the external terminal, which should not be resin molded, is isolated so that the resin cannot enter the portion by providing a region for contacting the mold so as to go around a certain cross section of the sensor.

In this state, the molten resin is injected into the mold, heat is taken by the mold to cool and solidify the molten resin, and then the mold is opened and the electrode housing is taken out. In this way, a small electrode housing on which the sensor is mounted can be obtained without using an adhesive agent or screws. In addition, since the portion of the sensor that contacts the mold so as to go around the certain cross section of the sensor is grasped by the mold, the portion is referred to as a clamp portion.

A problem here is destruction of the sensor due to a pressure when the molten resin is injected. For example, when the sensor is a flat card type, due to a difference in a resin amount existing on a front and a back of a card during resin filling, a bending force acts on the card with a clamp end as a fulcrum. When the bending force exceeds an allowable value, the card will break.

As a measure against this, in a method of preventing deformation by supporting a bending side with a jig or the like, a bending direction cannot be known until the molding is actually performed once. Further, since the mold must be modified after the bending direction is confirmed, a development period is lengthened and a development cost is increased. Therefore, there is a demand for a technique of nondestructively insert-molding a semiconductor device such as a sensor or a memory after the bending direction is controlled in advance.

In an embodiment, a wall thickness difference is provided on a front and a back of a semiconductor device such as a memory card, and a bending force acts from a thick wall side regardless of variations in a thickness of the semiconductor device. As a result, the bending can be prevented by supporting an end of the card on a thin wall side with a mold.

Figure 1:
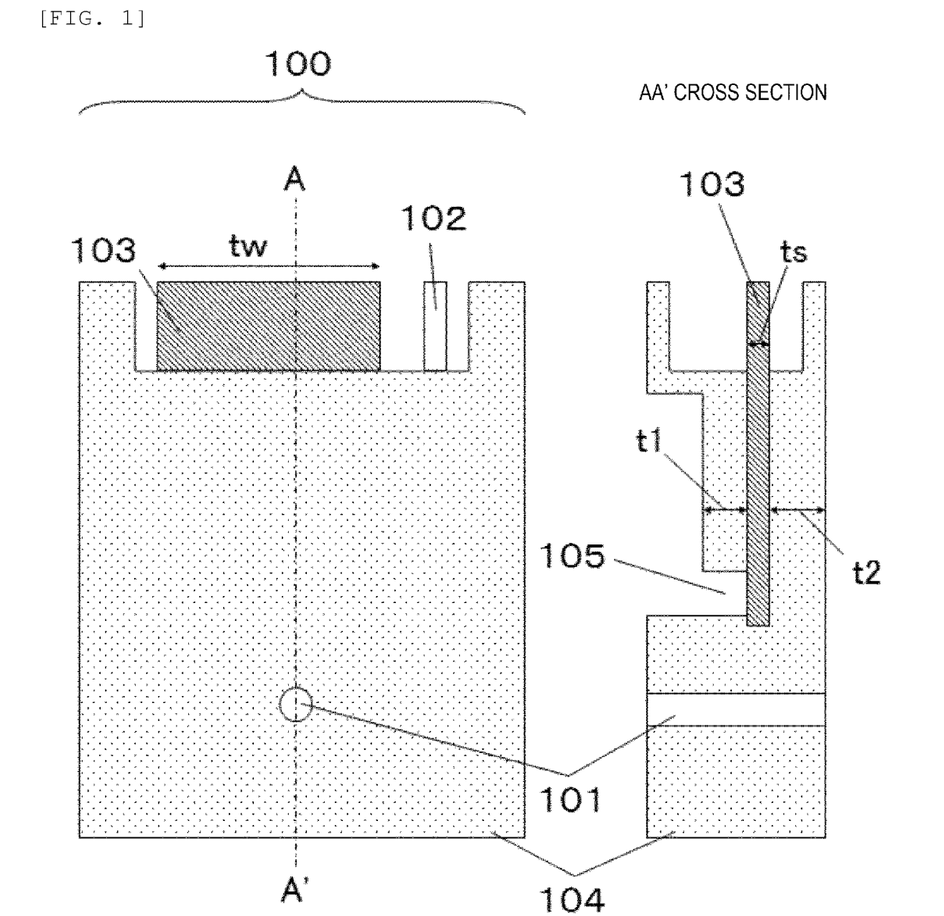
FIG. 1 is a schematic diagram showing a structure of an ion-selective electrode of a first embodiment.

As a result, as shown in FIG. 1, it is possible to obtain an electrode structure, which is an electrode 100 formed by resin molding a semiconductor device 103, includes a first resin mold portion formed on a front surface of the semiconductor device 103 and having a first thickness ($t1$), a second resin mold portion formed on a back surface of the semiconductor device 103 and having a second thickness ($t2$) greater than the first thickness, and an exposed portion 105 formed in a part of the first resin mold portion corresponding to an end of the semiconductor device.

According to the embodiment, the insert-molding can be performed without destructing a semiconductor device such as a sensor and a memory. As a result, for example, it is possible to provide a small ion-selective electrode on which the semiconductor device such as the sensor or the memory is mounted. Specifically, the embodiment has the following forms.

(Form 1) There is provided an electrode structure in which the flat semiconductor device 103 is molded with resin 104, the thicknesses $t1$, $t2$ of a front and back mold portions of the semiconductor device 103 are different, and the exposed portion 105 formed by exposing the end of the semiconductor device 103 to a side where a wall thickness is small is provided.

(Form 2) There is provided an electrode structure in which the exposed portion 105 is formed so that molten resin 108 cannot enter by contacting a mold 106 during resin molding.

(Form 3) There is provided an electrode structure in which a ratio of a cross-sectional width $tw$ to a thickness is of the semiconductor device 103 is 2 or more.

(Form 4) There is provided an electrode structure in which a difference between the wall thicknesses $t1$ and $t2$ of the front and back mold portions of the semiconductor device 103 is 20% or more.

(Form 5) There is provided an electrode structure having a distribution in the wall thicknesses $t1$ and $t2$ of the front and back mold portions of the semiconductor device 103, and an average wall thickness difference between t1 and t2 being 20% or more.

(Form 6) There is provided an electrode structure in which a distance to from the end of the semiconductor device 103 to an end of the exposed portion 105 is smaller than the thickness is of the semiconductor device 103.

(Form 7) There is provided an electrode structure in which resin gate 113 is made so that a shortest resin flow path to a side with a smaller average wall thickness and a shortest resin flow path to a side with a larger average wall thickness are equal or the shortest resin flow path to the side with the larger average wall thickness becomes shorter, and an average wall thickness difference is 10% or more.

(Form 8) There is provided an electrode structure in which a protrusion 110 is provided at the end of the semiconductor device 103, and an upper surface and a part of a side surface of the protrusion 110 are exposed.

(Form 9) There is provided an electrode structure in which a distance te2 between an end of the protrusion 110 and the end of the semiconductor device is smaller than the thickness is of the semiconductor device 103.

(Form 10) There is provided an electrode structure in which the flat semiconductor device 103 is resin molded, average wall thicknesses of the front and back mold portions of the semiconductor device 103 are different, and a spacer 111 whose softening temperature is equal to or higher than that of a mold resin is provided for the exposed portion 105 of the semiconductor device 103 on a side where the average wall thickness thereof is small.

(Form 11) There is provided an electrode structure including a convex portion or a concave portion 112 on a front surface of the spacer 111.

(Form 12) There is provided an electrode structure in which the spacer 111 is prevented from peeling off from the electrode 100 by an undercut 114.

Hereinafter, embodiments will be described with reference to the drawings.

First Embodiment

A structure of an ion-selective electrode of the first embodiment will be described with reference to FIG. 1. The ion-selective electrode 100 includes a specimen flow path 101 and an external terminal 102 electrically connected to the specimen flow path 101 via an ion-selective membrane (not shown). The flat semiconductor device 103 is molded with the resin 104. Here, the semiconductor device 103 is, for example, a sensor or a memory.

Under such a structure, the thickness t1 of the front mold portion and the thickness t2 of the back mold portion of the semiconductor device 103 are different, and the end of the semiconductor device on the side of the smaller wall thickness is exposed at the exposed portion 105.

In this way, the ion-selective electrode 100 of the first embodiment is an electrode formed by molding the semiconductor device 103 with the resin 104. The electrode 100 includes the first resin mold portion formed on the front surface of the semiconductor device 103 and having the first thickness (t1), and the second resin mold portion formed on the back surface of the semiconductor device 103 and having the second thickness (t2) greater than the first thickness. The electrode 100 includes the exposed portion 105 formed in a part of the first resin mold portion corresponding to the end of the semiconductor device 103.

Here, the exposed portion 105 is formed so that the mold resin cannot enter by contacting the mold during resin molding. By adopting this structure, it is possible to obtain the ion-selective electrode 100 in which the semiconductor device 103 is insert-molded in a nondestructive manner.

Figure 2:
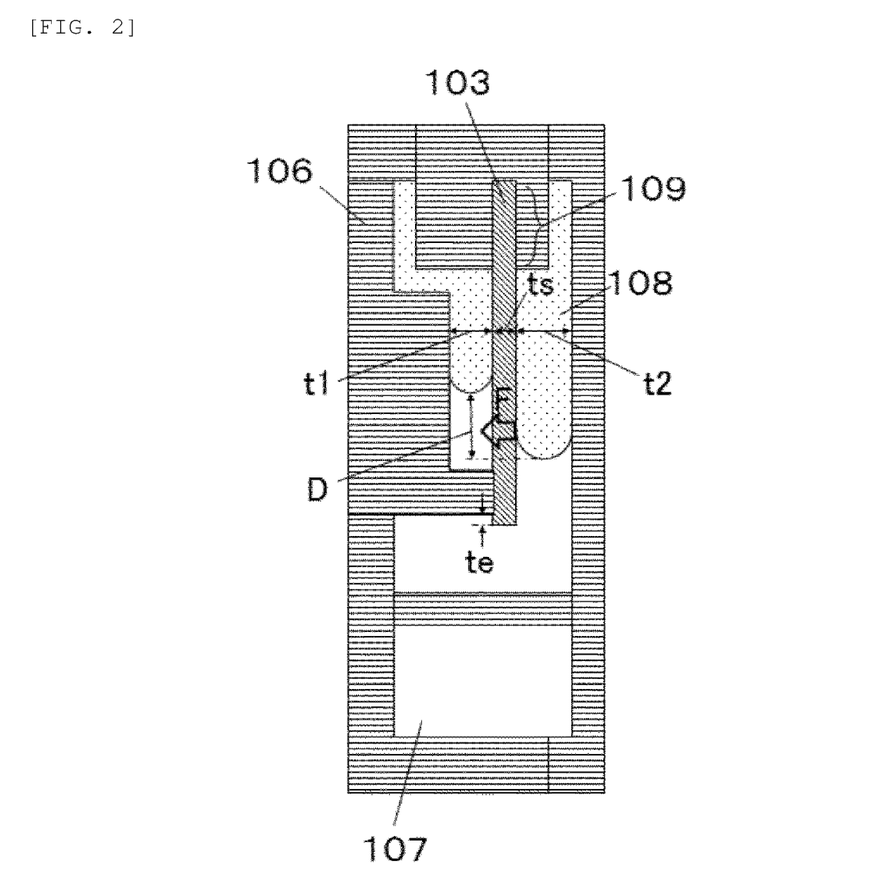
FIG. 2 is a schematic diagram of the ion-selective electrode of the first embodiment during resin filling.

A reason thereof will be described with reference to FIG. 2 that is a schematic diagram of a cross section of FIG. 1 taken along AA' during filling of the molten resin at the time of the insert-molding. In this structure, a difference is provided between maximum wall thicknesses t1 and t2 on the front and back of the semiconductor device 103, and as shown in FIG. 2, resin filling is promoted on a t2 side where the maximum wall thickness is greater. Here, a speed at a resin tip end during filling is proportional to a cube of the wall thickness. For this reason, a difference D between resin-filled regions occurs, and a bending force F due to a resin pressure acts from the t2 side with the larger maximum wall thickness toward a t1 side with a clamp end 109 as a fulcrum.

In this structure, the end on the t1 side having a smaller maximum wall thickness is supported by the mold 106. Therefore, displacement of the end of the semiconductor device 103 and bending deformation of the semiconductor device 103 can be prevented. Further, since both ends of the semiconductor device 103 are exposed, temperature control efficiency of the semiconductor device 103 (which generates heat during operation) using a blower or the like is improved. As a result, measurement accuracy of the ion-selective electrode 100 in which a potential measurement error with respect to temperature noise is large can be improved.

According to an experiment, if the ratio of the cross-sectional width Tw to the thickness Ts of the semiconductor device 103 was 2 or more, and the wall thickness difference between the front and the back of the semiconductor device was 20% or more, the insert-molding was possible in the nondestructive manner. It is considered that this is because the large ratio of the cross-sectional width Tw to the thickness Ts strongly influences deformation of the semiconductor device 103 dominated by bending in a thickness direction, and high sensitivity of the speed of the resin tip end during filling to the wall thickness.

Figure 5:
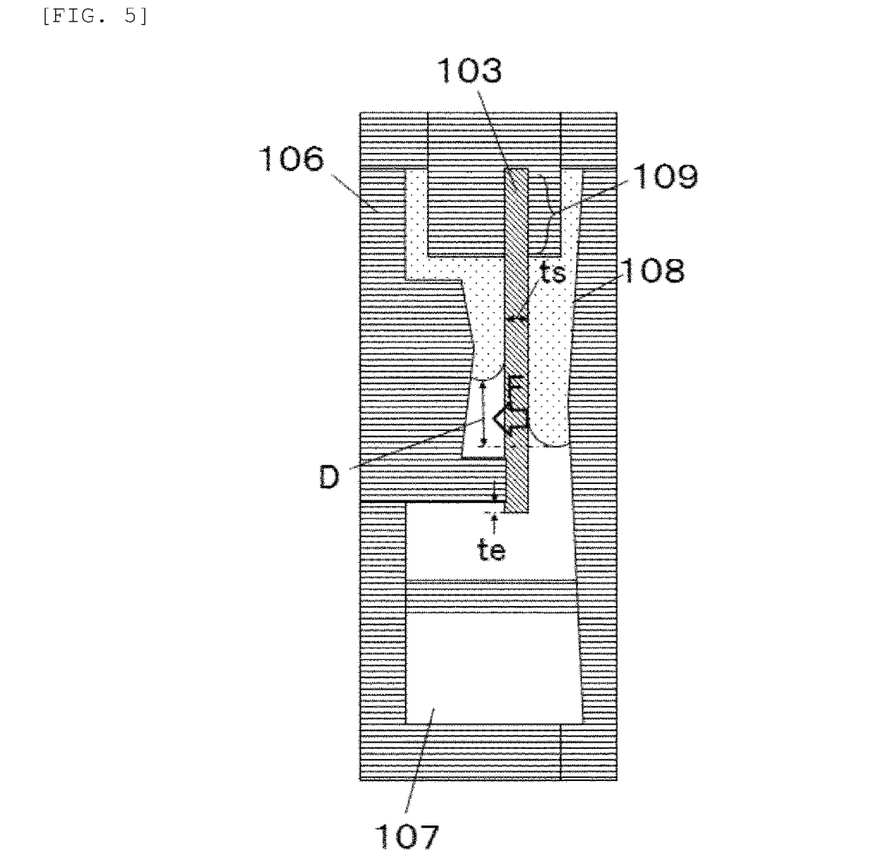
FIG. 5 is a schematic diagram of the ion-selective electrode of first embodiment in a structure having a distribution in a wall thickness of a semiconductor device during resin filling.

As shown in FIG. 5, in the structure having a distribution of the thickness of the semiconductor device 103, if the average wall thickness difference was 20% or more, the insert-molding was possible in the nondestructive manner. Further, the distance te from the end of the semiconductor device 103 to the end of the exposed portion 105 was smaller than the thickness ts (the minimum thickness for those with a distribution in thickness) of the semiconductor device 103. When the distance te was not smaller that the thickness ts, bending occurred on an end side of the semiconductor device 103 with respect to the exposed portion 105.

Figure 6:
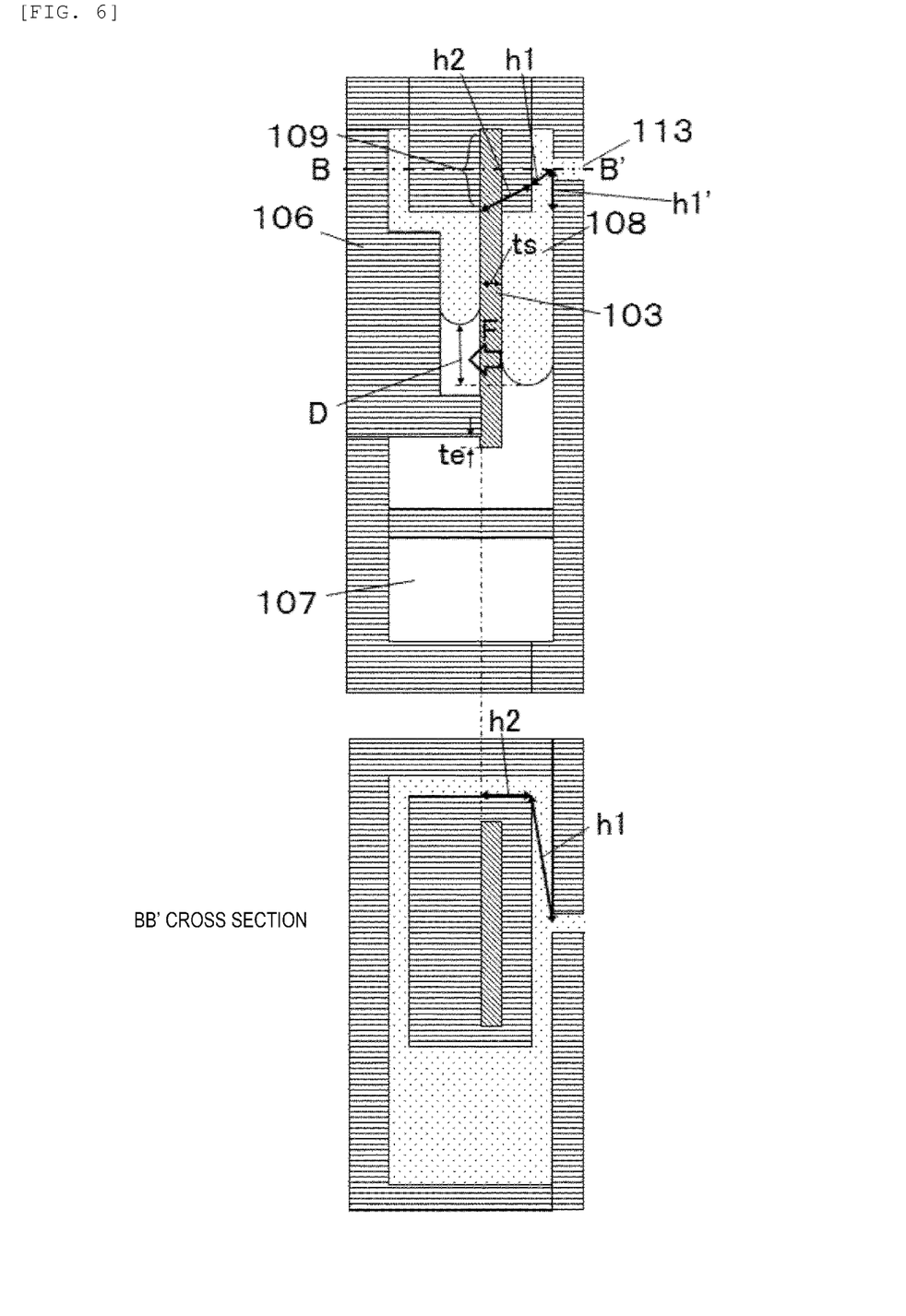
FIG. 6 is a schematic diagram showing a shortest resin flow path of the ion-selective electrode of the first embodiment during resin filling.

As shown in FIG. 6, the structure provides the resin gate 113, so that the shortest resin flow path (h1+h2 of FIG. 6) to the t1 side with the smaller maximum wall thickness and the shortest resin flow path (h1' of FIG. 6) to the t2 side with a larger maximum wall thickness are equal, or the shortest resin flow path to the side with the larger average wall thickness becomes shorter. As a result, the molten resin 108 was more quickly and stably filled into the side with the larger average wall thickness, and nondestructive insert-molding was possible even when the maximum wall thickness difference was reduced to 10%.

Here, the shortest resin flow path is a sum of line segments from a center point of the gate 113 to end points of the front and back resin mold portions of the semiconductor device 103 through a mold cavity 107. The shortest resin flow path is also referred to as a shortest path when the endpoints of the resin mold portions of the semiconductor device 103 is stretched from the gate 113 in the mold cavity 107 with a thread.

Second Embodiment

Figure 3A:
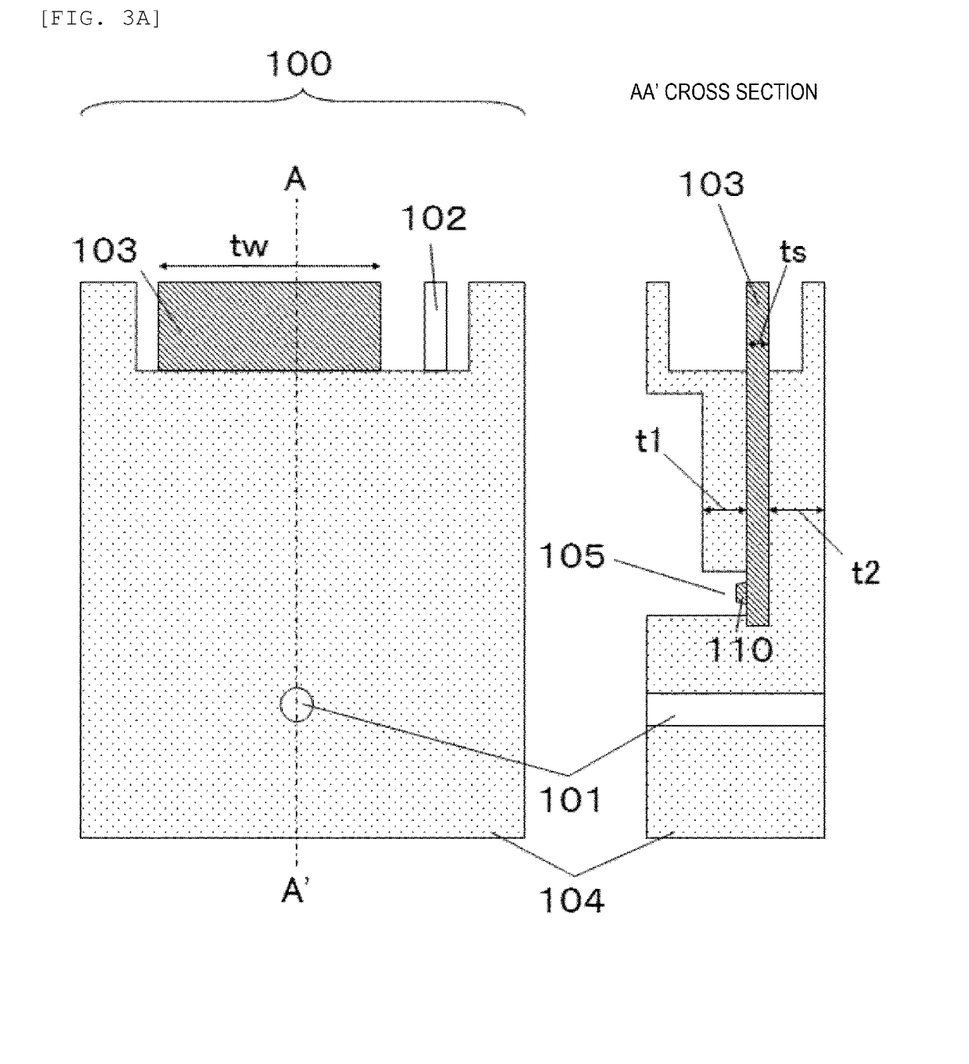
FIG. 3A is a schematic diagram showing a structure of an ion-selective electrode of a second embodiment.

A structure of an ion-selective electrode of the second embodiment will be described with reference to FIGS. 3A and 3B. A difference from the structure of the ion-selective electrode 100 of the first embodiment is that the protrusion 110 is provided at the end and the upper surface and a part of the side surface of the protrusion 110 are exposed. The other structure is almost the same as the structure of the ion-selective electrode 100 of the first embodiment, and the description thereof is omitted.

By adopting the structure of the ion-selective electrode 100 of the second embodiment, the deformation of the semiconductor device 103 when the molten resin is filled can be further reduced. The reason for this will be described below.

Figure 3B:
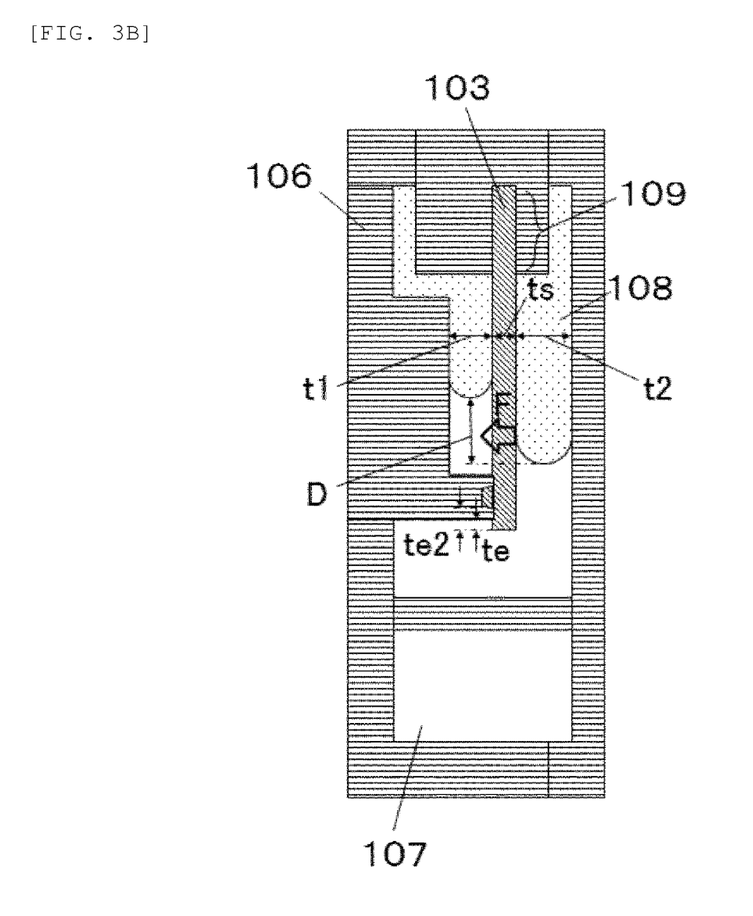
FIG. 3B is a schematic diagram of the ion-selective electrode of the second embodiment during resin filling.

As shown in FIG. 3B, when the molten resin is filled, bending occurs on the semiconductor device 103 to the side having the smaller maximum wall thickness with the end of the mold clamp portion 109 and a support portion (exposed portion 105) of the mold 106 as a fulcrum. At this time, among the force acting on the end of the semiconductor device 103, a component perpendicular to the front and back of the semiconductor device 103 is pushed back and canceled by the support of the mold 106, but there are a few horizontal components on the front and back of the semiconductor device 103.

In the structure of the ion-selective electrode of the second embodiment, since the side surface and the upper surface of the protrusion 110 are in contact with the mold 106, the protrusion 110 is caught (or by friction) and resistance is generated, and as a result, the displacement is further prevented.

In the experiment, if the end of the protrusion 110 was provided at a position having a distance to the end of the semiconductor device 103 equal to or closer to the thickness is of the semiconductor device 103, the protrusion 100 had a deformation preventing effect.

Third Embodiment

Figure 4A:
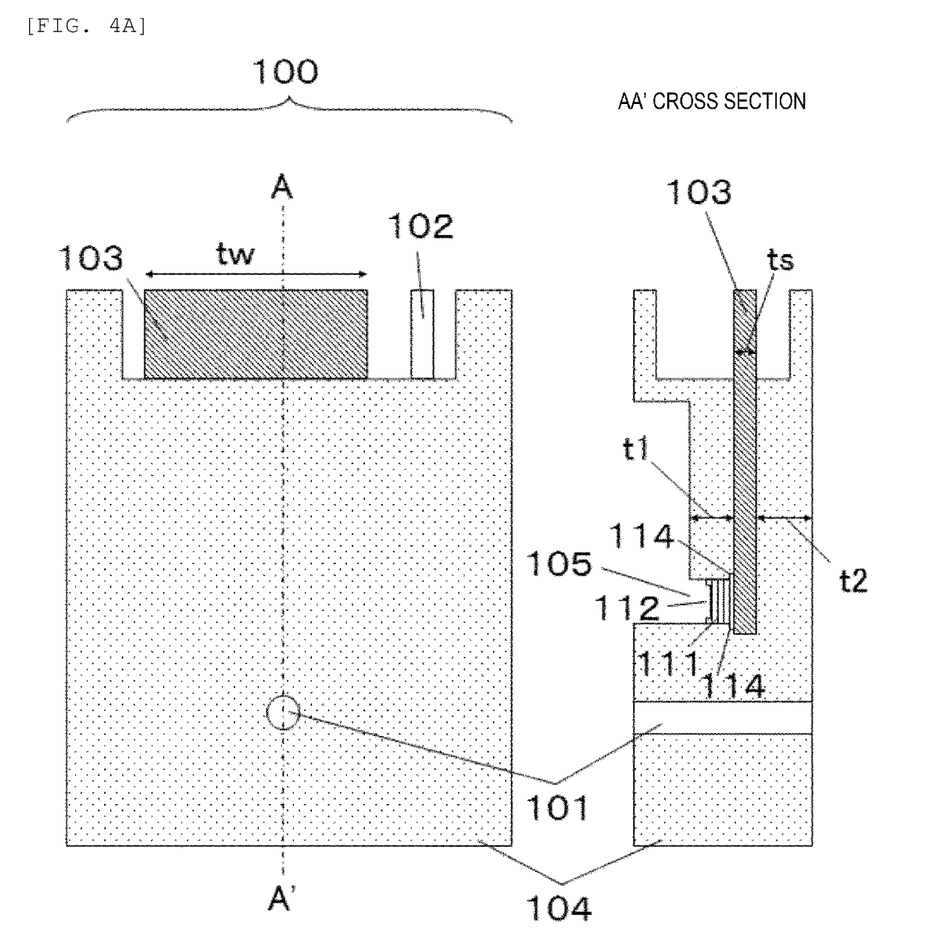
FIG. 4A is a schematic diagram showing a structure of an ion-selective electrode of a third embodiment.

A structure of an ion-selective electrode of the third embodiment will be described with reference to FIGS. 4A and 4B. A difference from the structure of the ion-selective electrode 100 of the first embodiment is that the spacer 111 whose softening temperature is equal to or higher than that of the mold resin is provided at the end of the semiconductor device 103 on aside having the smaller maximum wall thickness. The other structure is almost the same as the structure of the ion-selective electrode 100 of the first embodiment, and the description thereof is omitted.

By adopting the structure of the ion-selective electrode 100 of the third embodiment, a more reliable ion-selective electrode 100 in which the semiconductor device 103 is not exposed can be obtained. The reason for this will be described below.

Figure 4B:
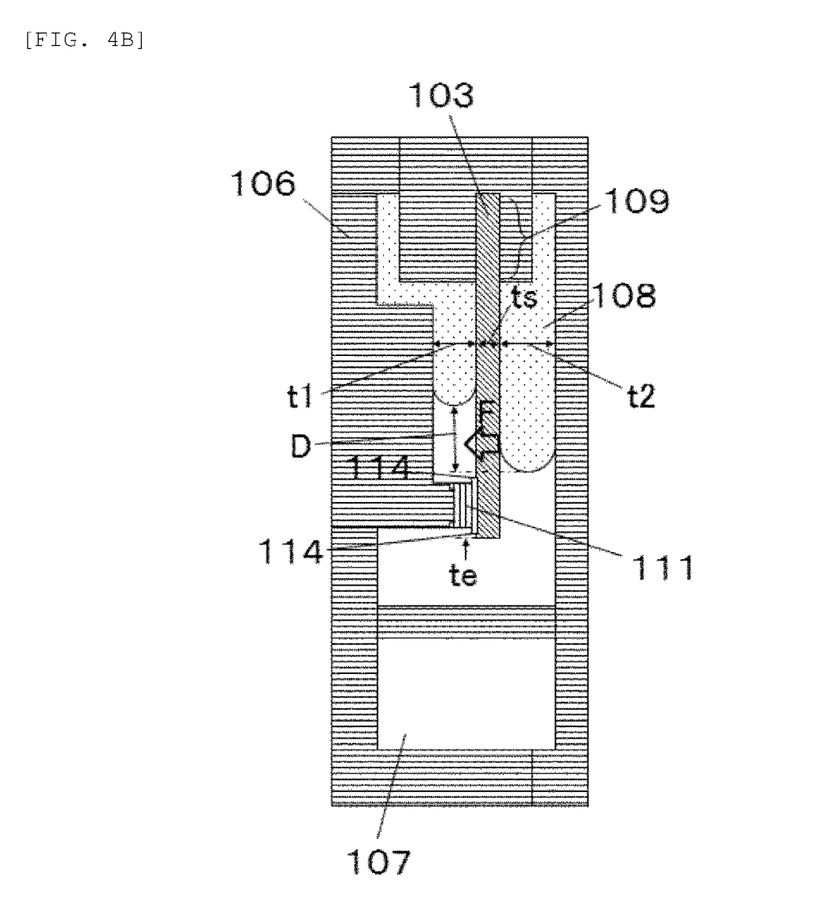
FIG. 4B is a schematic diagram of the ion-selective electrode of the third embodiment during resin filling.

As shown in FIG. 4B, the bending force F due to the resin pressure when the molten resin is filled acts from the t2 side with the larger maximum wall thickness toward the t1 side with the clamp end as the fulcrum. However, in the structure of the ion-selective electrode of the third embodiment, since the end on the t1 side with the smaller maximum wall thickness is supported by the mold 106 via the spacer 111 whose softening temperature is equal to or higher than that of the mold resin, displacement of the end of the semiconductor device 103 and bending deformation of the semiconductor device 103 can be prevented.

According to an experiment, if the wall thickness difference between the front surface and the back surface of the semiconductor device 103 where the spacer 111 did not exist was 20% or more, the insert-molding was possible in the nondestructive manner. In the structure having a distribution of the wall thickness on the front and back of the semiconductor device 103, if the average wall thickness difference was 20% or more, the insert-molding was possible in the nondestructive manner. Further, a distance from the end of the semiconductor device 103 to an end of the spacer 111 was smaller than the thickness is (the minimum thickness for those with a distribution in thickness) of the semiconductor device 103.

Further, a resin gate was provided, so that a shortest resin flow path to the t1 side with a smaller maximum wall thickness and a shortest resin flow path to the t2 side with a larger maximum wall thickness are equal, or a shortest resin flow path to the side with the larger maximum wall thickness becomes shorter. As a result, the resin was more quickly and stably filled into the side with the larger maximum wall thickness, and the nondestructive insert-molding was possible even when the maximum wall thickness difference was reduced to 10%.

As a result, the semiconductor device 103 is not exposed, and a material of the spacer 111 is set to have a higher softening point than the mold resin, so that the semiconductor device 103 is not exposed. As a result, a risk of damage to the semiconductor device 103 due to direct contact with a rod or a pointed object is reduced, and the electrode 100 having excellent ion selectivity in terms of reliability can be obtained.

Examples of the material of the spacer 111 include resin and ceramics. Here, there is a problem that a molding yield is lowered due to the spacer 111 being flowed by the molten resin and causing a positional deviation. As a measure against this, as shown in FIG. 4A, the convex portion or the concave portion 112 is provided on the front surface of the spacer 111, and a concave portion or a convex portion matching the convex portion or the concave portion 112 is provided on the mold 106. As a result, movement of the spacer 111 in a direction perpendicular to the thickness thereof can be restricted, and the positional deviation of the spacer 111 when the molten resin is filled can be prevented to improve the molding yield. Further, by forming the undercut 114 in the spacer 111, the spacer 111 can be prevented from peeling off due to vibration, impact, or the like after the electrode housing is molded.

The invention is not limited to the ion-selective electrode, but can be widely applied to semiconductor devices in which the semiconductor device 103 is insert-molded.

REFERENCE SIGN LIST 100 electrode
101 specimen flow path
102 external terminal
103 semiconductor device
104 resin
105 exposed portion
106 mold
107 mold cavity
108 molten resin
109 mold clamp portion 110 protrusion
111 spacer
112 concave portion of spacer
113 gate
114 undercut

The invention claimed is:

1. An ion-selective electrode, comprising:
   a first resin mold portion formed on a front surface of a semiconductor device and having a first thickness;
   a second resin mold portion formed on a back surface of the semiconductor device and having a second thickness greater than the first thickness;
   an exposed portion formed in a part of the first resin mold portion corresponding to an end of the semiconductor device;
   a specimen flow path formed in the second resin molded portion; and
   an external terminal having a potential configured to change in response to an ion concentration of a specimen in the specimen flow path.

2. The ion-selective electrode according to claim 1, wherein
   the semiconductor device is a flat semiconductor sensor or a semiconductor memory.

3. The ion-selective electrode according to claim 1, wherein
   a ratio of a cross-sectional width of the semiconductor device to a thickness of the semiconductor device is 2 or more.

4. The ion-selective electrode according to claim 1, wherein
   a wall thickness difference between the first thickness of the first resin mold portion and the second thickness of the second resin mold portion is 20% or more.

5. The ion-selective electrode according to claim 1, wherein
   the first thickness of the first resin mold portion and the second thickness of the second resin mold portion each have a distribution in a wall thickness, and an average wall thickness difference is 20% or more.

6. The ion-selective electrode according to claim 1, wherein
   a distance from a lower end surface of the semiconductor device to a lower end surface of the exposed portion is smaller than the thickness of the semiconductor device.

7. The ion-selective electrode according to claim 1, wherein
   the exposed portion further includes a protrusion portion formed on the end of the semiconductor device.

8. The ion-selective electrode according to claim 7, wherein
   an upper surface and at least a part of a side surface of the protrusion portion are exposed.

9. The ion-selective electrode according to claim 7, wherein
   a distance between a lower end surface of the protrusion portion and a lower end surface of the semiconductor device is smaller than the thickness of the semiconductor device.

10. The ion-selective electrode according to claim 1, wherein
    the exposed portion further includes a spacer formed on the end of the semiconductor device.

11. The ion-selective electrode according to claim 10, further comprising:
    a concave portion or a convex portion formed on a front surface of the spacer.

12. The ion-selective electrode according to claim 10, further comprising:
    an undercut portion formed on the spacer.

* * * * *